(12) United States Patent
Hsieh

(10) Patent No.: US 7,786,904 B1
(45) Date of Patent: Aug. 31, 2010

(54) VOLTAGE LEVEL DIGITAL SYSTEM

(76) Inventor: Mingchih Hsieh, 19256 Bellwood Dr., Saratoga, CA (US) 95070

( * ) Notice: Subject to any disclaimer, the term of this patent is extended or adjusted under 35 U.S.C. 154(b) by 49 days.

(21) Appl. No.: 12/291,138

(22) Filed: Nov. 5, 2008

(51) Int. Cl.
*H03M 5/02* (2006.01)
(52) U.S. Cl. ........................................................ 341/56
(58) Field of Classification Search ............... 341/56–59
See application file for complete search history.

(56) References Cited

U.S. PATENT DOCUMENTS 4,499,454 A * 2/1985 Shimada ........................ 341/58
7,251,207 B2 * 7/2007 Sakagami et al. ........ 369/59.23
7,355,532 B2 * 4/2008 Kim ............................. 341/56
7,579,968 B2 * 8/2009 Van Acht et al. ............... 341/56

\* cited by examiner

*Primary Examiner*—Brian Young
(74) *Attorney, Agent, or Firm*—Robert S. Smith

(57) ABSTRACT

A digital system programmed to accept words wherein each of said words is a collection of "bit" voltage values with each bit value represented by its position in the word and the value of a base raised to a power, said base multiplied by an integer, m.

5 Claims, 4 Drawing Sheets

1. SELECT REFERENCE VALUE, V

2. ADD FIRST BIT COLUMN TO A TABLE

3. DIVIDE FIRST BIT COLUMN OF TABLE INTO L SEGMENTS

4. ADD FOLLOWING COLUMNS, EACH ADDED COLUMN EQUAL TO PRECEDING COLUMN DIVIDED BY L

5. DIVIDE EACH BIT COLUMN INTO L LEVELS

FIG. 2

1. SELECT THE LEVEL OF THE FIRST BIT OF THE REFERENCE SCALE HAVING A VALUE LESS THAN WORD AND ASSIGN THAT BIT TO THE FIRST BIT OF THE SOURCE BIT

2. SELECT LEVEL OF NEXT BIT LESS THAN DIFFERENCE BETWEEN WORD VALUE AND FIRST BIT

3. REPEAT STEP 2 FOR EACH REMAINING BIT OF REFERENCE SCALE.

FIG. 3

SUM VALUES OF DIGITAL VALUE OF H TO PROVIDE ANALOG EXPRESSION

MAP VALUE OF H ONTO REFERENCE SCALE

CONVERT ANALOG H ON REFERENCE SCALE TO DIGITAL FORMAT HAVING n' BITS AND L LEVELS

FIG. 4

ADD BIT VALUES OF SOURCE WORD OF n BITS TO FORM ANALOG H ON REFERENCE SCALE

MAP ANALOG VALUE OF H ON REFERENCE SCALE TO n' BITS OF REFERENCE SCALE

FIG. 5

VOLTAGE LEVEL DIGITAL SYSTEM

FIELD OF THE INVENTION

This invention relates to digital system architecture. In the context of this specification, the "digital system" is understood to include any system which communicates with other digital systems such as memories, input-output devices, computers, etc. The invention particularly relates systems in which the "word" is expressed as a combination of digital and analog format and to methods such as changing an expression of a quantity from one digital system (e.g., analog-binary) to another digital system (e.g., analog-quaternary).

The digital system of this invention is characterized as the analog-digital expression of the "words" of the system requiring significantly less wiring than the binary systems of the present art.

In one application, the invention relates to a method for interfacing a first number of terminals of a first system to a second number of terminals of a second system where the signals on the first and second set of terminals represent data in respective analog-digital format.

BACKGROUND AND INFORMATION DISCLOSURE

In the context of this specification, the term "physical medium" includes anything to which the term "size" has significance. Size is typically expressed as a number of smaller standard units that equals the size of the physical medium.

For example, the length (size) of a football field (the physical medium) is 100 yards where a "yard" is a "standard unit"

As another example, a barrel of oil (the physical medium) is fifty gallons where "gallon" is a "standard" unit.

As another example, "a physical medium" is a truckload of coal wherein the size is expressed in terms of tons (the standard unit).

An "analog" expression of size is understood to represent a number of smaller standard units that equals the size of the physical medium where all of the standard units have the same size.

A multilevel digital expression of size is understood to be a series of number of groups of standard units, in which the size of each group is different from size of the other groups according to an arithmetic rule. The number of groups of one kind is the "level" of the group.

In a typical physical situation, the actual size of an entity does not change. However, expression of size can be selected according to convenience of the user as being either an analog expression or a multilevel digital expression.

The digital system has evolved over the millennium as a way of expressing size of the physical medium in terms of quantity of standard units.

A size between one and nine digits has been expressed by originating the terms, zero, one, two, three, - - - eight, nine. These terms have been derived to express a size of standard units between 0 and 9.

However, because it is awkward to keep adding new names to numbers greater than 9, the deci-digital system was developed to provide greater convenience.

The decimal system has a base of 10 meaning that the size of a physical medium is a number of standard units where the number, N, is - - -

$$N = n_0 \times 10^0 + n_1 \times 10^1 + n_2 \times 10^2 + \text{- - -}$$

(n=0, 1, 2, 3 - - - 9 up to a limit determined by the size of the physical medium.)

The popularity of this system is undoubtedly the result of the convenience for humans having a hand with 10 fingers.

Use of a binary system has exploded with the development of semiconductor components having two energy levels designated 1 and 0 to express size.

The binary system has a base of two digits to which are assigned the values 0 and 1.

The size of the system is expressed as:

$$N = n \cdot 2^0 + n'' 2^1 + n''' 2^2 + \text{- - -}$$

Where n"" is either 1. or 0

Digital systems are formed on semiconductor chips, packaged in housing provided with pins (terminals). Each chip consists of many gates and memory cells plus a number of input and output attachment points to complex integrated circuits.

An item of information (data, instructions, addresses, etc.) is transmitted between components on wires as a "word" (a group of bits) in binary digital format. Each wire is assigned to transmit a single bit of the word and the value of the bit is either a 1 or zero multiplied by $2^n$ where n is 0, 1, 2, - - -

A major advantage of expressing the data as bits is that the original series of bits values can be preserved indefinitely.

The resolution of a word depends on the number of bits (word length).

Digital systems are wired with a fixed number of bits per word corresponding to the number of wires of the bus that carries the data.

In digital systems presently on the market, the most common word length is sixteen bits, The digital system executes operations in which a word of one set of sixteen bits is transmitted simultaneously from sixteen terminals of one component over sixteen wires to another set of sixteen terminals of another component The larger words (sixteen, thirty two or sixty four bits) provide that data is transmitted in parallel 16, or 32 or 64 times as fast respectively, as can be sent by passing the word as single bits serially over one wire.

However, the larger the number of bits per word, the larger will be the number of wires required to send the word in parallel.

Therefore the ideal choice as to the number of bits per word is a compromise between speed of transmission (number of bits transmitted in parallel) and the limit to complexity of the circuit imposed by increasing the number of wires, terminals, etc.

SUMMARY OF THE INVENTION

It is an object of this invention to provide a method for changing one expression for a size of a physical medium expressed as words having one number of bits per word to another expression for the same size but having words with a different number of bits per word.

It is contemplated that the method have utility where it is required to reduce the complexity of wiring between components such as between computers or within a computer between circuits.

The invention is directed toward a method wherein the value of the incoming word in one digital system is (mapped) assigned to a position on a "reference" scale and the assigned position on the reference scale is then expressed as the outgoing word in a second digital system. The values of the ingoing and outgoing words are the same but the number and values of the individual bits of each group are different.

The source signal has bits designated n=1, 2, 3 . . . , wherein the nth bit has $L^n$ levels.

The converted signal has bits designated n'=1, 2, 3 . . . , wherein the $n'^{th}$ bit has $L^{n'}$ levels.

The exponents in the exponential factors of the digital terms are negative. This arrangement is often more convenient for handling complex problems than expressions with positive exponents (+1, +2, - - - )

BRIEF DESCRIPTION OF THE DRAWINGS

FIG. 2 presents the steps for constructing a reference scale.

FIG. 3 lists the steps of mapping the value of a word, having a value H, presented in analog form onto the reference scale of FIG. 2

FIG. 4 lists the steps of mapping the value of a word, having a value H, presented in analog form onto the reference scale of FIG. 2

FIG. 5 lists the steps for converting a digital source word expressed on n bits with L levels to a "converted" digital word expressed on n' bits with 'L levels

DISCUSSION OF THE DRAWINGS

This invention deals with representing the value of a physical medium

In a digital system, the value is expressed as a series of words. The value of each word is expressed as individual voltages on a number, n, of "bits". Each bit is a terminal or wire whose value is represented by its position in the word.

A value expressed in analog format, H, may also be expressed in digital format. The following equation of this invention, for representing a value, H, illustrates this statement:

$$H = m_1 V/L + m_2 V/L^2 + m_3 V/L^3 + \text{- - -} \ m_n V/L^n$$

Figure 1:
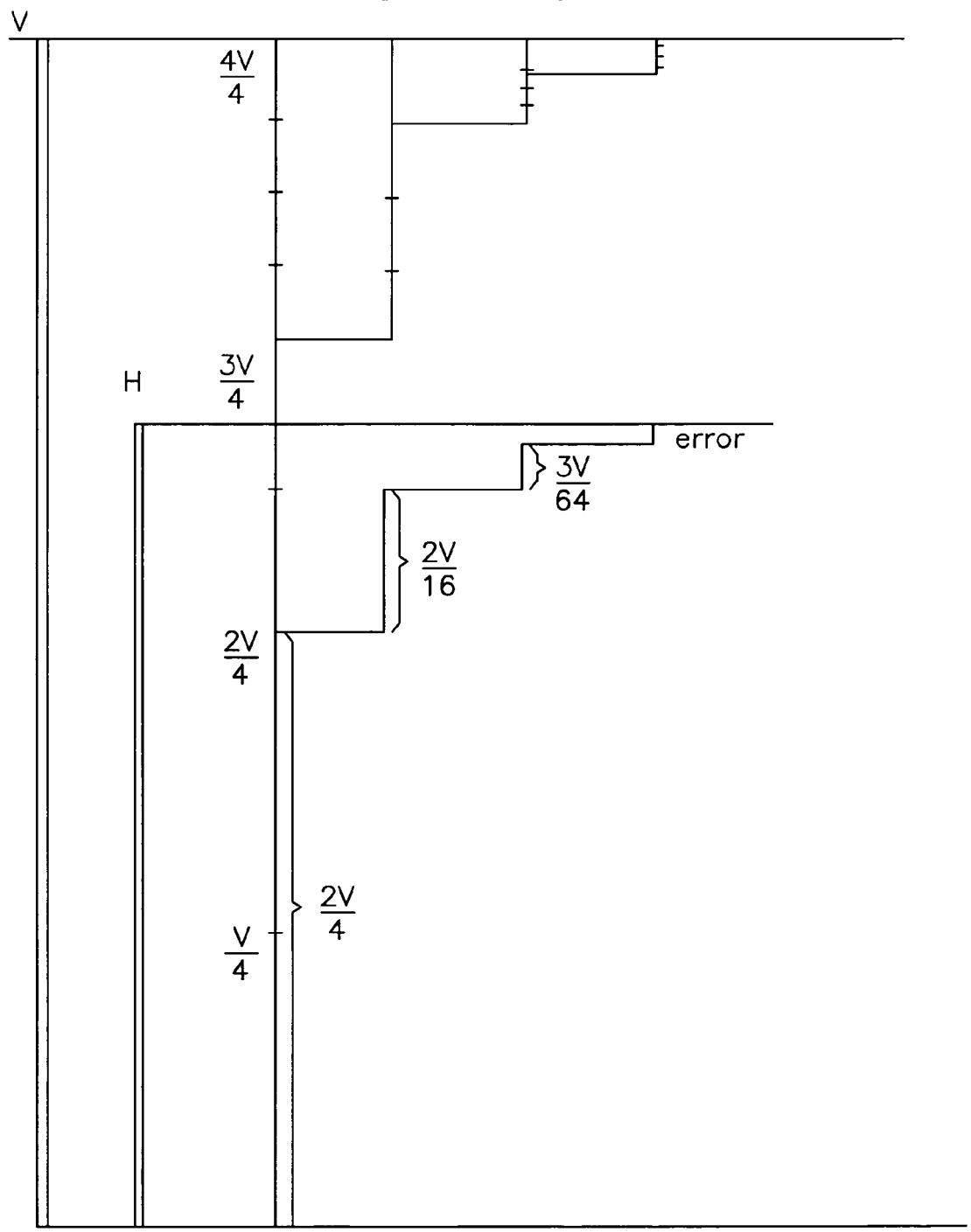
FIG. 1 is a method for constructing a reference scale illustrated in diagram format and mapping a value onto the reference scale.

FIG. 1 illustrates the comparison of the analog expression to the digital expression by representing values (volts) as column values (height).

H is the value of a physical medium.

The value of word, H, is represented as a column having a (height) value, H: The value of a reference value is represented by the column V.

An advantage of expressing a bit value as being any one of L levels is that the required number of bits to express a maximum value is reduced. Each bit may be assigned any one level of a plurality of L levels L between 0 and L.

The foregoing expression is the "real" value of the word by which is meant that the magnitude (in volts) of the nth bit is only $1/L^n$ as strong as the first bit. This places a limitation on the resolution of the word in cases where losses occur such as when the word is transmitted over distance. For such situations the "real" word is replaced by a "pseudo" word in which the voltage value of each bit is multiplied by a factor $L^p$ where p is the position of the respective bit in the word.

When the word is involved in calculations, it is reverted back to its "real" value by multiplying the bit in position P by $1/L^p$ The selected number of levels is a hardware design decision being a compromise between a tolerable number of bits in the word and the required resolution of voltage between voltage levels.

The number of bits, n, is also a hardware decision based on the required resolution between word values.

A method for constructing a reference scale and mapping a value onto the reference scale is illustrated as a diagram in FIG. 1. for the case n=4 and L=4 and presented as a list of steps in FIG. 2

Referring to FIGS. 1 and 2:

the following four steps are performed to create a "reference scale" that is useful for dealing with any words, H, that are entered into the system In step 1 a table of columns is created in which a first column represents a reference value, V. V is a value that is larger than the value of any value of the physical medium that is entered into the program.

In step 2, a reference value V is entered into the first column where V is a value selected arbitrarily to be larger than any anticipated word (value) to be entered into the computer.

In the second step, the first column is divided into L level segments where L is an arbitrary number of levels selected to maintain a realistic tolerance of separation of the levels.

In the third step, another column is added having the length of a single segment between neighboring levels of the previous column.

In a fourth step, additional columns are added wherein each column has a length equal to the length of the segment of the previous column; and is divided into 1/L segments, In FIG. 3 steps are presented for mapping an analog value H onto the reference scale, where the converted form of H is digital format, an exercise that has a number of applications that are part of the invention.

In step 1, a level for the first bit of H is selected from the first bit column created from the reference scale whose value is less than and closest to the value of H. This is the value of the first bit in the digital expression of H.

In step 2, a level for the next bit of H is selected from the next column created from the reference scale where the difference between H and the sum of selected levels from the previous step(s) is greater than the selected level of the next bit and less than the next higher level of the next level.

In step 3, the procedure of step 6 is repeated for each remaining bit of the reference scale.

FIG. 4 lists the steps of mapping the value of a word, having a value H, presented in digital form onto the reference scale of FIG. 2

In step 1, The sum of each level value of each bit of H is simply a voltage equal to the value of H In step 2 The value H is mapped directly onto the reference scale FIG. 5 lists the steps for converting a digital source word expressed on n bits with L levels to a "converted" digital word expressed on n' bits with 'L levels In step 1, The n bit values of the source word are added together providing an analog expression of H:

I step 2 the analog value is mapped onto the reference scale, V.

In step 3 the value of H represented as an analog on the reference scale is converted to a digital form of n' bits of 'L levels per bit. applying the techniques of FIGS. 1 and 2.

There has been described a program adaptable on a computer for performing various operations involving a digital expression having a plurality of bits wherein the value of each bit is further defined as one of a plurality of voltage levels.

A major advantage of expressing the value of H as a sum of digital terms having negative powers of L compared to compared to expressing H in terms having positive powers, of a base is ability of further defining the value of each bit with level numbrssuch that the resultant value of the bit is not duplicated by a combination of lower order bits when the value of the bits are designated by level numbers.

Figure 6:
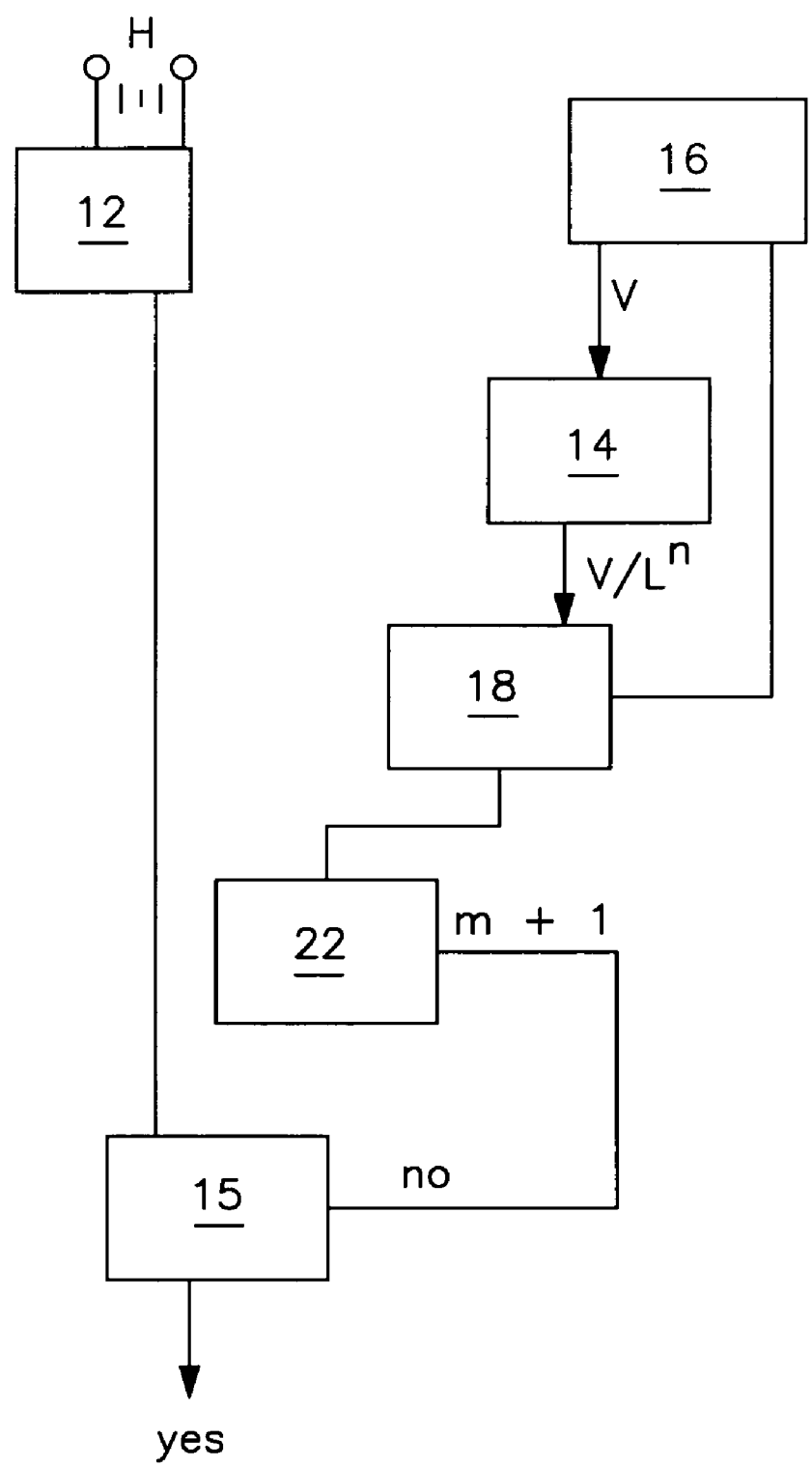
FIG. 6 is the diagram of a digital system for carrying out the steps of this invention

FIG. 6 is the diagram of a digital system 10 for practicing the methods of the invention.

There is shown a set of n input terminals 11 for receiving a source signal H. The input terminals are connected to the input terminals of an adder 12 which adds all of the bit values H. In the case where H is expressed in analog form, H is input into only one terminal.

When the computer has only one input terminal, H is simply an analog signal of L of any one of L levels.

A register 14 is shown with an input responsive to a key board 16 for entering and storing a reference value, V.

A divider 18 is shown connected to the register 14 and the keyboard for dividing V into L segments, and dividing each segment by L n' times where each division by L generates one more bit value represented at a respective output terminal being one of n output terminals 20 of the computer 10.

A multiplier 22 is shown connected to a comparator 15 with output terminals for successively comparing H to each value $mV/L^n$ until a difference less than $mV/L^{n}-H$ is found. The value, $mV/L^n$ is then output to the N output terminal.

There has been described a system supported by a computer for representing and operating with values expressed in digital form wherein each successive bit in the digital expression has a more negative integer exponent.

The system can be used in a plurality of situations in which the present invention has advantages over current practice where the expression of value has digital terms with positively increasing exponents.

For example in the present invention, the assignment of levels does not introduce interference between lower order terms with higher order terms.

The description of this invention illuminates a fundamental relationship between three parameters, L, n V,v when designing a computer in which each bit of the word is divided into L levels:

$$V = L^n v$$

which must be followed in order to avoid a situation where one value of level number, m, and bit position, n represents no more than one number.

n is the number of bits;

v is the smallest increment in the series expression of H;

V is the largest value that the system can represent for a given value of n and v, Thus the expression for the value of H can involve ascending powers of v by simply substituting $V = L^n$ v into the expression for H, so that the expression becomes $$H = (L^n v) m_1/L + (L^n v) m_2/L^2 + (L^n v) m_3/L^3 + \cdots (L^n v) m_n/L^n$$

Variations and modifications of the methods may be contemplated after reading the specification and studying the drawings that are within the scope of the invention I define the scope of invention by the appended claims.

What is claimed is:

1. A digital system for converting an analog expression for a quantity, H, to a multilevel digital expression, comprising:

at least one input terminal for receiving said analog expression, representing said quantity, H;

an adder 12 having adder input terminals connected to said at least one input terminal for presenting said signal, H, at output terminals of said adder in analog format;

a keyboard means for entering into said system selected numbers, L and n being parameters of a multilevel digital system, where 1/L is a base of n digits, $1/L$, $1/L^2$, $1/L^3$, $1/L^n$, each digit raised to a selected level p/L where p is an integer between 0 and L;

a register connected to said keyboard for storing n and L;

said register arranged for entering and storing an arbitrary reference value, V, in said register where V is any value that is larger than any anticipated value of H;

a divider connected to said register and keyboard arranged for successively dividing V by L, said division by L repeated n times wherein each division by L generates one more digit represented at a respective output terminal of said divider where n is an integer selected to provide that $V/L^n$ is less than a tolerated error in the value of H converted to said multilevel digital format;

a multiplier connected to output terminals of the divider and to the keyboard means for entering a respective level value, $m_p$, and multiplying digit, $1/L^p$, by $m_p$ presented at input terminals of the multiplier;

said multiplier accumulating at output terminals of said multiplier a totality of said generated multi level digits as said each multilevel digit is newly created and added to the accumulation registered by the multiplier;

a comparator arranged for successively comparing said accumulation of said multilevel digits to analog expression of H to where a difference of said accumulation subtracted from H, is less than said tolerated error in the value of H converted to said multilevel digital format.

2. The digital system of claim 1 wherein value, 'H, in said multilevel digital system is expressed by a word having a form $$H = V(m_1/L + m_2/L^2 + m_3/L^3 + \cdots m_n/L^n)/L$$

wherein V, is a reference quantity expressed in analog form whose value is arbitrarily selected to be a greater value than any anticipated value, H, wherein L is an arbitrary whole number corresponding to base of said digital system, and $m_p$ is a level number of the $p^{th}$ digit being an integer between 0 and L, n is a total number of digits selected to provide that H is expressible to an accuracy of $L^{-n}$.

3. The digital system of claim 1 further comprising:

a table including:

a "V" column being an analog representation of said reference value, "V";

said representation of "V" being L equal value segments;

where L is an integer selected to establish a base value of the digit;

members of each additional column;

n columns divided into segments;

segments of each column having a size of the segments of the next preceding column divided by L providing that the last column is divided into segments of value $V/L^n$;

wherein n is a whole number equal to a number of added columns of said table and each column corresponds to a digit of a numeric digital system having a base 1/L;

H being expressed as a sum of members, one member from each column wherein each member equals a digit value, $V/L^n$ multiplied by level factor, $m_p/L$, and where $m_p$ is a whole number having a value selected from the range, 0 to L.

4. The digital system of claim 1 having terminals for inputting and out putting a data word represented by digits, each digit including one of said terminals attached to a wire representing a value of the digit by being in a position relative to other bits and to which one of a plurality of voltages is applied.

5. The digital system of claim 4 having input terminals arranged to accept words represented by one number of bits and number of bit levels and output terminals arranged to transmit words represented by a different number of bits and different number of bit levels.

* * * * *